US012253548B2

(12) United States Patent  
Corti et al.

(10) Patent No.: US 12,253,548 B2  
(45) Date of Patent: Mar. 18, 2025

(54) SYSTEM FOR MONITORING AND ANALYZING ELECTRIC PARAMETERS

(71) Applicant: UNIVERSITÀ DEGLI STUDI DI FIRENZE, Florence (IT)

(72) Inventors: Fabio Corti, Scandicci (IT); Giacomo Talluri, Fiesole (IT); Francesco Grasso, Florence (IT); Marco Somma, Florence (IT); Libero Paolucci, Grosseto (IT)

(73) Assignee: UNIVERSITÀ DEGLI STUDI DI FIRENZE, Florence (IT)

( * ) Notice: Subject to any disclaimer, the term of this patent is extended or adjusted under 35 U.S.C. 154(b) by 320 days.

(21) Appl. No.: 17/790,051

(22) PCT Filed: Dec. 31, 2020

(86) PCT No.: PCT/IB2020/062594  
§ 371 (c)(1),  
(2) Date: Jun. 29, 2022

(87) PCT Pub. No.: WO2021/137193  
PCT Pub. Date: Jul. 8, 2021

(65) Prior Publication Data  
US 2023/0054387 A1 Feb. 23, 2023

(30) Foreign Application Priority Data  
Dec. 31, 2019 (IT) .......................... 102019000025855

(51) Int. Cl.  
*G01R 19/25* (2006.01)  
*H02J 13/00* (2006.01)

(52) U.S. Cl.  
CPC .... *G01R 19/2513* (2013.01); *H02J 13/00002* (2020.01); *H02J 13/00022* (2020.01)

(58) Field of Classification Search  
None  
See application file for complete search history.

(56) References Cited

U.S. PATENT DOCUMENTS

2005/0194936 A1* 9/2005 Cho ..................... G01R 31/367  
320/132  
2006/0119368 A1 6/2006 Sela et al.  
(Continued)

FOREIGN PATENT DOCUMENTS

| EP | 3549227 | 10/2019 |
| GB | 2 560 032 A | 8/2018 |
| WO | 2015/160779 A1 | 10/2015 |

*Primary Examiner* — Jermele M Hollington  
*Assistant Examiner* — Carl F. R. Tchatchouang  
(74) *Attorney, Agent, or Firm* — Maschoff Brennan

(57) ABSTRACT

A system for monitoring and analyzing electrical operating parameters of a load in an electric network includes a smart socket placed in series between the load and the electric network. The smart socket includes a voltage detection module that measures a voltage value in the electric network between the ends of the load, a current detection module in the electric network that measures a current value adsorbed by the load, and a control unit connected to the voltage detection module and to the current detection module. In particular, the control unit comprises a neural network arranged to carry out a training comprising the steps of definition of a number n of events association, to each event $E_i$ of a number $m_i$, of patterns $p_{ij}$ of predetermined current and/or voltage trends, extrapolation of characteristic parameters $c_{ik}$ distinguishing the pattern $p_{ij}$ associated with the classified event $E_i$.

19 Claims, 5 Drawing Sheets

(56) References Cited

U.S. PATENT DOCUMENTS

| | | | |
|---|---|---|---|
| 2010/0301784 A1* | 12/2010 | Tagome | H02M 1/28 |
| | | | 318/494 |
| 2013/0138651 A1 | 5/2013 | Lu et al. | |
| 2016/0164288 A1 | 6/2016 | Yang et al. | |
| 2017/0111000 A1* | 4/2017 | Saito | H02P 27/06 |
| 2017/0271915 A1* | 9/2017 | Quinn | G06Q 50/06 |
| 2017/0336444 A1 | 11/2017 | Sela | |

* cited by examiner

SYSTEM FOR MONITORING AND ANALYZING ELECTRIC PARAMETERS

FIELD OF THE INVENTION

The present invention relates to the field of "Smart Grids", i.e. electricity distribution networks that integrate and efficiently manage the behaviour and actions of all users connected to the network, with the aim of guaranteeing an economically efficient operation of the electrical system, with low losses and with a high level of safety, continuity and quality of supply.

In particular, the invention relates to a system for monitoring and analyzing electrical operating parameters of a load in an electrical network.

DESCRIPTION OF THE PRIOR ART

Various devices are currently known, called in jargon "smart sockets", capable of measuring electrical quantities, in particular mains voltage and current absorbed by the load. Although they perform their function very well, they are, however, very specific devices that are able to process the measured values locally to provide general indications about some electrical parameters, such as the power absorbed by the load, which can be used by the operators of the electric network to offer customers differentiated contracts based on specific consumption characteristics.

To date, in order to conduct advanced analyzes on the characteristics of the electrical system, network analyzers and/or oscilloscopes are used, positioned at strategic points of the electric network. These devices make it possible to meet the shortcomings of smart sockets but, at the same time, introduce problems related to:

high costs;
impossibility of remote control;
complexity of the instrumentation.

EP3549227 describes a smart socket that can monitor and control consumption within an electrical network, periodically measuring the voltage values of the network and the current absorbed by a load connected to that network.

However, this system is limited to reading these values to remotely control the switching on and off of the load in order to optimize consumption and/or other performance indices of the load itself. On the other hand, there is no intelligent analysis of the parameters detected in order to carry out a network and load diagnostics.

In documents US2017336444, US2006119368, WO2015160779, US2016164288, US2013138651 some diagnostic systems of an electrical network are described, in which a network monitoring and pattern detection of the voltage and/or current trends is performed to compare them with predetermined patterns, generally simplified by extrapolating only some threshold values.

However, none of these systems is able to provide recognition of the specific anomaly detected on the network, rather limiting itself to the recognition of a generic anomaly and thus slowing down the process of diagnosing the origin of the disorder. Furthermore, none of these systems provides the possibility of increasing the diagnostic capabilities through continuous training of the microcontroller.

SUMMARY OF THE INVENTION

It is therefore a feature of the present invention to provide a system for monitoring and analyzing electrical operating parameters of a load in an electric network that allows to provide data processing that can be used in the Smart Grid environment for the active management of energy consumption of an electrical network.

It is also a feature of the present invention to provide such a system which allows to describe the operation of the electrical network in real time.

It is still a feature of the present invention to provide such a system that allows to conduct different types of network analysis and diagnostics according to the needs of a user.

These and other objects are achieved by a system for monitoring and analyzing electrical operating parameters of a load in an electric network according to claims from 1 to 10.

According to another aspect of the invention, a method for monitoring and analyzing electrical operating parameters of a load in an electric network that makes use of the system according to claims from 1 to 10.

BRIEF DESCRIPTION OF THE DRAWINGS

Further characteristic and/or advantages of the present invention are more bright with the following description of an exemplary embodiment thereof, exemplifying but not limitative, with reference to the attached drawings wherein.

DESCRIPTION OF A PREFERRED EXEMPLARY EMBODIMENT

Figure 1:
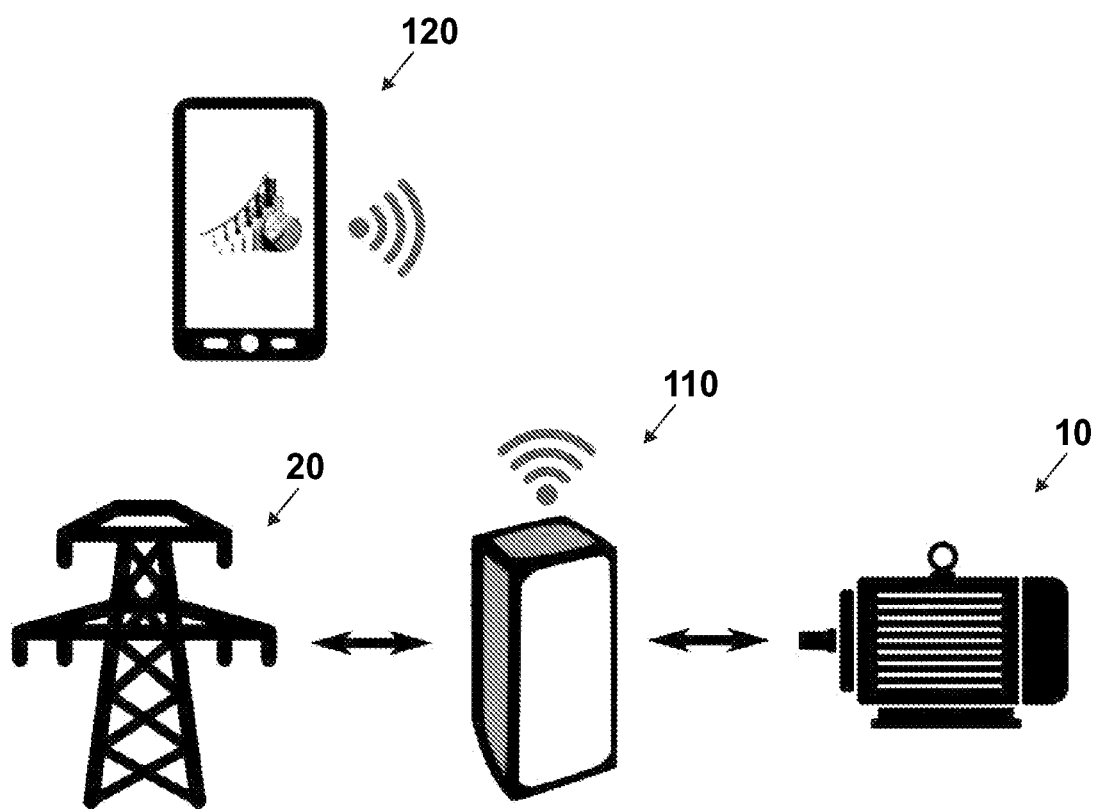
FIG. 1 diagrammatically shows the system for monitoring and analyzing electrical operating parameters of a load in an electric network, according to the present invention.

With reference to FIG. 1, the system for monitoring and analyzing electrical operating parameters of a load 10 in an electric network 20, according to the present invention, comprises a smart socket 110 and a graphic interface 120, which can be placed near the smart socket 110 or in a remote position.

In particular, the smart socket 110 comprises a voltage detection module arranged to measure a voltage value in the network, as an electric potential difference between the ends of the load 10 and a current detection module in the electric network 20 arranged to measure a current value adsorbed by the load 10, when the load 10 is connected to the electric network 20.

The smart socket 110 also comprises a microcontroller connected to the voltage detection module and to the current detection module.

In particular, the microcontroller comprises an artificial intelligence such as, for example, an artificial neural network.

With reference even at FIG. 5, the microcontroller, using the neural network, is arranged to carry out a preliminary step of training in which n events $E_i$ are classified corresponding to various types of disturbances or network operating anomalies that need to be classified during the following step of analysis.

In particular, the training provides a first step where the neural network acquires a plurality of patterns $p_{ij}$ of predetermined current and/or voltage trends that are associated, according to the instructions provided, to respective events $E_i$. More in detail, for each event $E_i$ the neural network acquires a number $m_i$ of patterns $p_{ij}$ of current and/or voltage trend that highlight the disturbance or anomaly represented by this event $E_i$.

On the basis of the set of $m_i$ patterns $p_{ij}$ associated with the event $E_i$, the neural network is therefore capable of classifying this event E; and of extrapolating a plurality of characteristic parameters $C_{ik}$ distinguishing the patterns $P_{ij}$ of this set. Such characteristic parameters $C_{ik}$, chosen independently by the neural network, allow to evaluate whether a new current and/or voltage trend pattern acquired by the neural network is attributable or not to the same set and therefore is, possibly, attributable to the event $E_i$ associated with that set.

Figure 2:
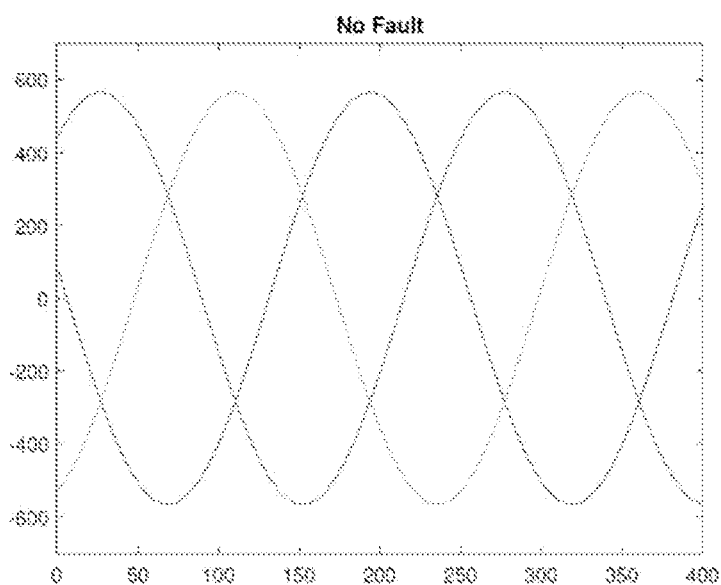
FIG. 2 shows the graphic of one waveform representing a voltage trend associated with a status of correct operation of the electric network.
Figure 2A:
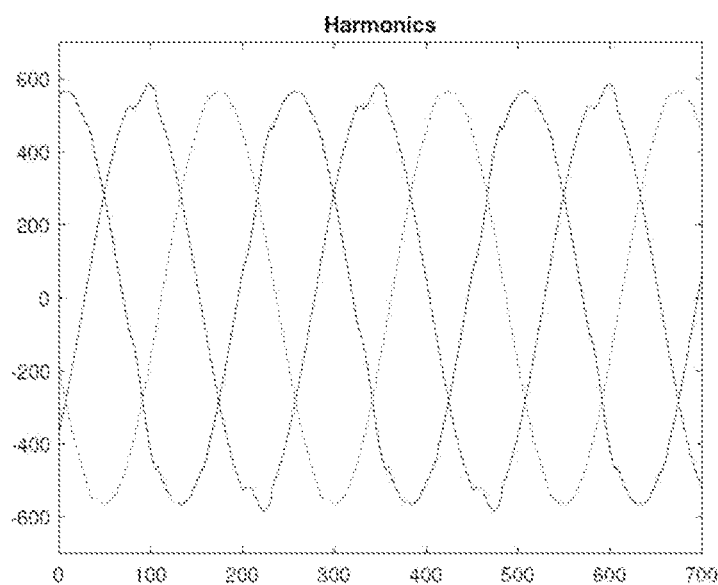
FIG. 2A shows the of one waveform representing a voltage trend associated with a status of harmonic distortion of the electric network, or "harmonics"
Figure 2B:
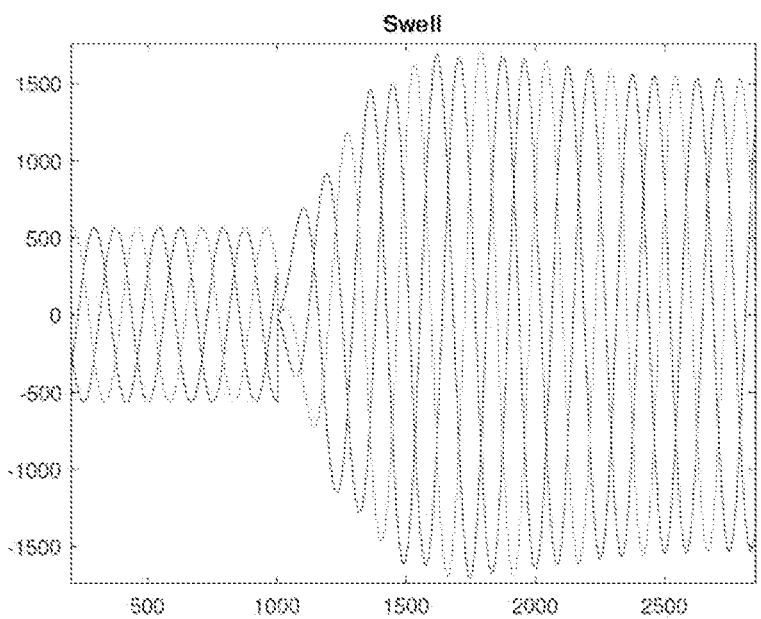
FIG. 2B shows the graphic of one waveform representing a voltage trend associated with a status of increased voltage of the electric network, or "swell"
Figure 2C:
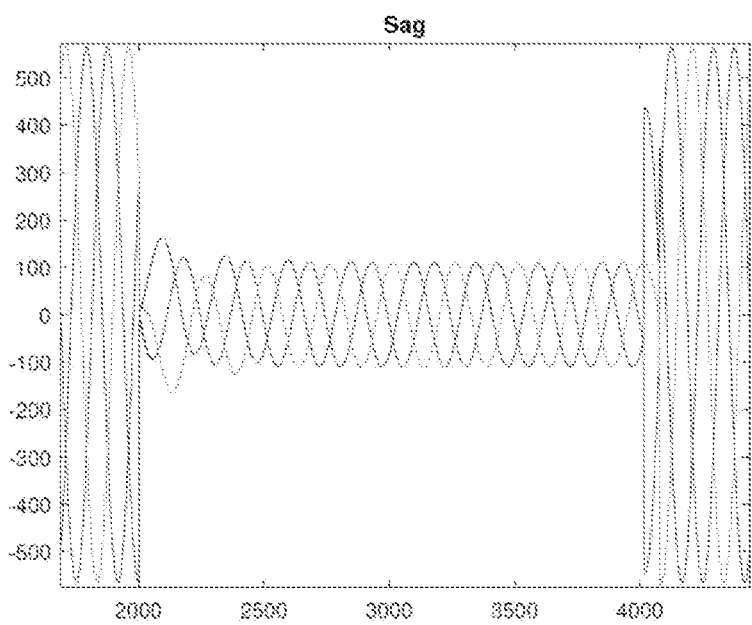
FIG. 2C shows the graphic of one waveform representing a voltage trend associated with a status of voltage drop of the electric network, or "sag"
Figure 2D:
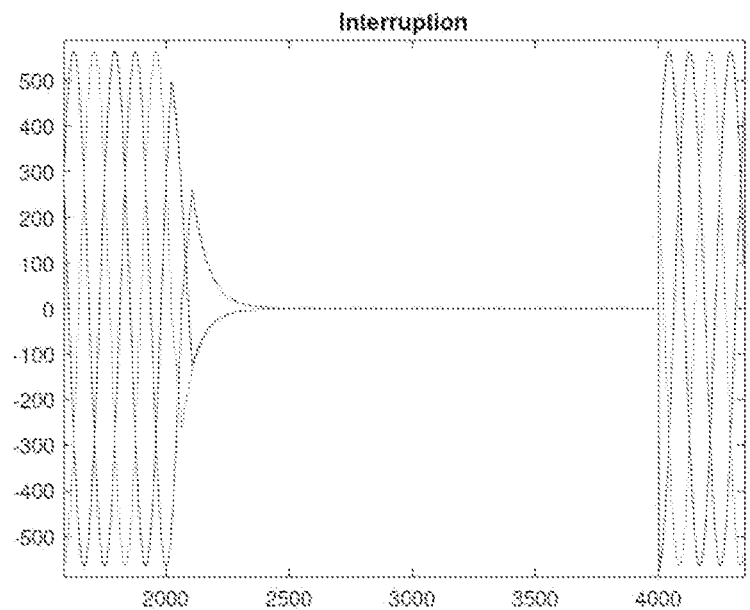
FIG. 2D shows the graphic of one waveform representing a voltage trend associated with a status of voltage interruption of the electric network, or "interruption"
Figure 2E:
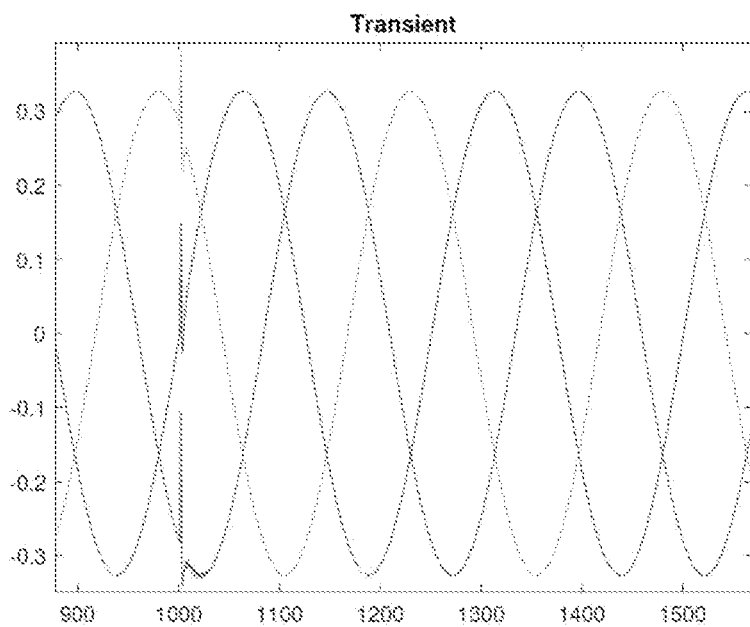
FIG. 2E shows the graphic of one waveform representing a voltage trend associated with a status of peak voltage of the electric network, or "transient"
Figure 3:
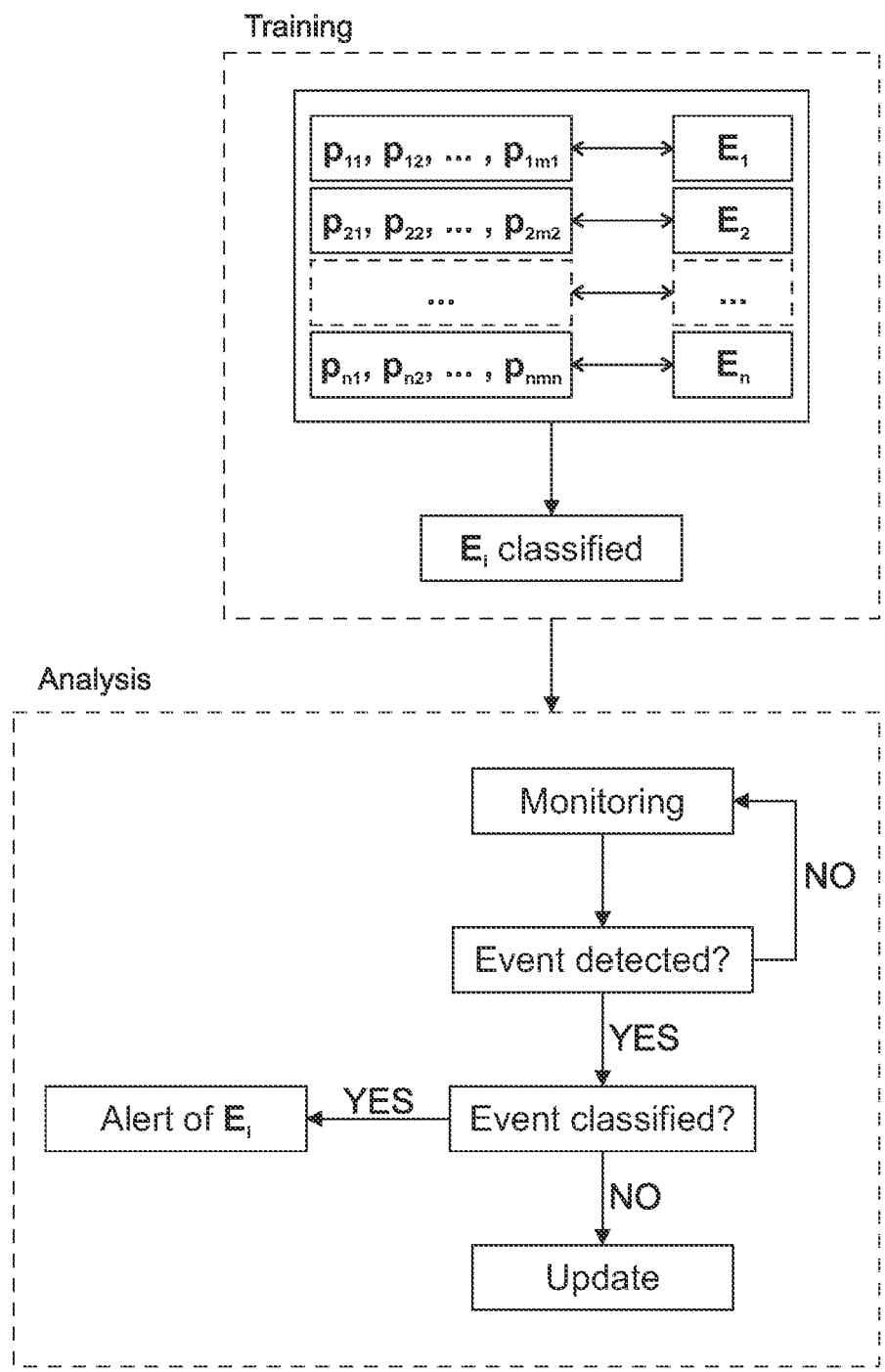
FIG. 3 diagrammatically shows the steps of training and analysis performed by the microcontroller.

After placing the smart socket 110 in series between the load 10 and the electric network 20, the microcontroller makes it possible to set the kind of diagnostic to carry out in the network. The microcontroller proceeds then to carry out a periodic acquisition, for example with frequency f=10 kHz, of the voltage and current values in the electric network, obtaining the current and voltage trends over time. Such current and voltage trends over time, as well as the current and voltage trends used in the training, can be shown graphically by the waveforms, some examples of which are shown in FIGS. 2 to 2E.

The microcontroller then proceeds to carry out a comparison between the measured voltage and current trends and some predetermined voltage and current trends corresponding to the correct functioning of the network, to identify the presence of possible anomalous patterns.

In case that at least one anomalous pattern is detected, the microcontroller proceeds, through the neural network, to the search of characteristic parameters $C_{ik}$ that allow to verify whether the anomalous pattern is attributable to one of the events E; classified during the step of training. In particular, in case that the identified anomalous pattern comprises at least one predetermined number of characteristic parameters $C_{ik}$ of a classified event $E_i$, the microcontroller confirms the presence of this event $E_i$ in the acquired voltage and/or current trend and proceeds to communicate this disturbance or anomaly, for example by means of a sound and/or acoustic alarm emitted by to smart socket 110 and/or by the graphic interface 120.

If, on the other hand, the anomalous pattern does not include at least the aforementioned predetermined number of characteristic parameters $C_{ik}$ of a classified event $E_i$, the microcontroller confirms the presence of an unclassified event in the acquired voltage and/or current trend.

In this second case, the microcontroller can then proceed in different ways, depending on the instructions provided during the step of training.

In particular, in a first embodiment, the microcontroller can simply issue an alarm that notifies the detection of an unclassified event, possibly requesting an update of the training step by inserting the unclassified event among the events being defined.

Alternatively, the microcontroller can proceed with the analysis of the electrical network 20 until a predetermined number of unclassified events associated with patterns having a certain number of common characteristic parameters $c_{ik}$ is reached. The commonality of these characteristic parameters $C_{ik}$ indicates in fact that the anomalous patterns detected do not show disturbances different from each other but all highlight the same disturbance and must therefore be included in a set associated with a new event $E_i$ to be classified. This classification operation of the new event $E_i$ can be carried out by an external operator, upon signaling from the microcontroller, or be carried out independently by the microcontroller itself.

Therefore, the system for monitoring and analyzing electrical parameters, according to the present invention, allows, thanks to the training step and the continuous updating of this step, an extremely higher capacity to recognize the disturbance or operating anomaly compared to prior art systems.

In particular, the comparison between the detected voltage and/or current trends and the predetermined voltage and/or current trends can take place both numerically, processing the voltage and/or current values detected by the smart socket, and at graphic level, processing the spectrogram obtained from the detected voltage and/or current waveforms and verifying their correspondence with a predetermined spectrogram.

In the first case, the microcontroller can make use, for example, of recurrent neural networks with the Long Short Term Memory algorithm which allows to process sequences of values and is divided into three main cells:

Forget State

Input State

Output State

At each step the input signal is processed and an output is defined starting from the information deriving from the previous inputs and from the current one.

In the second case, the microcontroller can for example make use of convolutional neural networks that recognize graphic patterns of the spectrograms of sampled waveforms.

Furthermore, the microcontroller periodically sends the network diagnostics to the graphic interface 120, which includes both the operating status of the network and some quantities of interest derived from the voltage and current trends, such as the active power, the reactive power and phase shift (cos φ) of the network. In addition, the microcontroller can send an alarm signal in case the network operating status is anomalous.

In this way, an operator can constantly monitor the status of the network and the processed data can be used for the optimization of the network itself or for the identification and location of faults on the network or in the load itself.

By way of example, FIG. 2 shows a waveform representing a trend over time of a three-phase voltage associated with a state of correct operation, while FIGS. 2A to 2E show waveforms associated with states of malfunction. of the network.

The foregoing description some exemplary specific embodiments will so fully reveal the invention according to the conceptual point of view, so that others, by applying current knowledge, will be able to modify and/or adapt in various applications the specific exemplary embodiments without further research and without parting from the invention, and, accordingly, it is meant that such adaptations and modifications will have to be considered as equivalent to the specific embodiments. The means and the materials to realise the different functions described herein could have a different nature without, for this reason, departing from the field of the invention. it is to be understood that the phraseology or terminology that is employed herein is for the purpose of description and not of limitation.

The invention claimed is:

1. A system for monitoring and analyzing electrical operating parameters of a load in an electric network, said system comprising a smart socket arranged to be placed in series between said load and said electric network, said smart socket comprising:
   a voltage detection module comprising a voltage sensor configured to measure a voltage value in said electric network, as an electric potential difference between the ends of said load;
   a current detection module in said electric network comprising a current sensor arranged to measure a current value adsorbed by said load, when said load is connected to said electric network; and
   a microcontroller connected to said voltage detection module and to said current detection module, wherein:
      said microcontroller is configured to carry out:
         a periodic acquisition, with a predetermined frequency f, of said voltage value in said electric network, obtaining a voltage trend over time; and
         a periodic acquisition, with a predetermined frequency f, of said current value adsorbed by said load, obtaining a current trend over time;
      said microcontroller includes a neural network arranged to carry out a training that includes the steps of:
         definition of a number n of events $E_i$, each event $E_i$ representing a disturbance or an operating anomaly of said electric network;
         association, to each event $E_i$, of a number nit of patterns $m_i$ of predetermined current and/or voltage trends, where $p_{ij}$ indicates the j-th pattern associated with the i-th event $E_i$, with i=1, 2, ..., n and j=1, 2, ..., $m_i$, obtaining a number n of classified events $E_i$;
         for each classified event $E_i$, extrapolation of characteristic parameters $c_{ik}$ distinguishing the patterns $p_{ij}$ associated with said classified event $E_i$, where $c_{ik}$ indicates the k-th characteristic parameter of the i-th classified event $E_i$; and
      said neural network is also arranged to carry out an analysis of said voltage and/or current trend acquired by said microcontroller, said analysis including the steps of:
         comparison of said acquired voltage and/or current trend with predetermined voltage and/or current trends corresponding to the correct operation of said electric network;
         definition in said acquired voltage and/or current trend of possible anomalous patterns with respect to said predetermined voltage and/or current trends; and
         in case of identification of at least one anomalous pattern, search for said characteristic parameters $c_{ik}$ in said or each identified anomalous pattern with consequent:
            confirmation of the presence of said classified event $E_i$ in said acquired voltage and/or current trend, in case that said or each identified anomalous pattern comprises at least one predetermined number of characteristic parameters $c_{ik}$ of a classified event $E_i$; and
            confirmation of the presence of an unclassified event in said acquired voltage and/or current trend, in case that said or each identified pattern does not comprise at least said predetermined number of characteristic parameters $c_{ik}$ of a classified event $E_i$.

2. The system for monitoring and analyzing electrical operating parameters of a load in an electric network, according to claim 1, wherein, in case of confirmation of the presence of said classified event $E_i$ in said acquired voltage and/or current trend, said microcontroller is arranged to generate a corresponding alarm of acoustic and/or optical type showing the type of classified event $E_i$, identified.

3. The system for monitoring and analyzing electrical operating parameters of a load in an electric network, according to claim 1, wherein, in case of confirmation of the presence of an unclassified event in said acquired voltage and/or current trend, said microcontroller is arranged to generate a corresponding alarm of acoustic and/or optical type.

4. The system for monitoring and analyzing electrical operating parameters of a load in an electric network, according to claim 1, wherein, upon reaching a predetermined number of confirmations of unclassified events, said microcontroller is arranged to request an updating of said step of definition of events $E_i$.

5. The system for monitoring and analyzing electrical operating parameters of a load in a electric network, according to claim 1, wherein, upon reaching a predetermined number of confirmations of unclassified events associated with patterns having a certain number of common characteristic parameters $C_{ik}$ between them, said microcontroller is arranged to associate said patterns to a classified event and/or to request the definition of a new classified event associating it to said patterns.

6. The system for monitoring and analyzing electrical operating parameters of a load in an electric network, according to claim 1, wherein:
   said microcontroller is arranged to generate a spectrogram of one waveform of the voltage arranged to represent said acquired voltage trend and/or a spectrogram of one waveform of the current arranged to represent said acquired current trend, and
   said comparison of said acquired voltage and/or current trend with said predetermined voltage and/or current trends is made through a search for graphic correspondence between said spectrogram of said wave form of said acquired voltage and/or current trend with spectrograms of wave forms arranged to represent said predetermined voltage and/or current trend.

7. The system for monitoring and analyzing electrical operating parameters of a load in an electric network, according to claim 1, wherein said microcontroller is arranged to carry out a computation of a plurality of physical quantities of interest starting from said acquired voltage and/or current trend.

8. The system for monitoring and analyzing electrical operating parameters of a load in an electric network, according to claim 1, wherein a graphic interface is also provided arranged to show to a user the possible presence of classified events $E_i$ and/or of unclassified events.

9. The system for monitoring and analyzing electrical operating parameters of a load in an electric network, according to claim 1, wherein said microcontroller is also arranged to carry out a filtering of said acquired voltage and/or current trend to remove signal noise.

10. The system for monitoring and analyzing electrical operating parameters of a load in an electric network, according to claim 1, wherein said periodic acquisitions of said values of voltage and of current are carried out with frequency f=10 KHz.

11. A method for monitoring and analyzing electrical operating parameters of a load in an electric network, said method comprising the steps of:
   prearrangement of a smart socket comprising:
      a voltage detection module comprising a voltage sensor arranged to measure a voltage value in said electric network, as an electric potential difference between the ends of said load;
      a current detection module comprising a current sensor in said electric network arranged to measure a current value adsorbed by said load, when said load is connected to said electric network; and
      a microcontroller connected to said voltage detection module and to said current detection module, said microcontroller comprising a neural network;
   definition of a number n of events $E_i$, each event $E_i$ representing a disturbance or an operating anomaly of said electric network;
   association, to each event $E_i$, of a number $m_i$ of patterns $p_{ij}$ of predetermined current and/or voltage trends, where $p_{ij}$ indicates the j-th pattern associated with the i-th event $E_i$, with i=1, 2, . . . , n and j=1, 2, . . . , $m_i$, obtaining a number n of classified events EL;
   for each classified event EL, extrapolation of characteristic parameters $c_{ik}$ distinguishing the patterns $p_{ij}$ associated with said classified event where $c_{ik}$ indicates the k-th characteristic parameter of the i-th classified event $E_i$;
   arranging said smart socket in series between said load and said electric network;
   periodic acquisition, with a predetermined frequency f, of said voltage value in said electric network, obtaining a voltage trend over time;
   periodic acquisition, with a predetermined frequency f, of said current value adsorbed by said load, obtaining a current trend over time;
   comparison of said acquired voltage and/or current trend with predetermined voltage and/or current trends corresponding to the correct operation of said electric network;
   definition in said acquired voltage and/or current trend of possible anomalous patterns with respect to said predetermined voltage and/or current trends; and
   in case of identification of at least one anomalous pattern, search for said characteristic parameters $c_{ik}$ in said or each identified anomalous pattern with consequent:
      confirmation of the presence of said classified event $E_i$ in said acquired voltage and/or current trend, in case that said or each identified anomalous pattern comprises at least one predetermined number of characteristic parameters $c_{ik}$ of a classified event $E_i$; and
      confirmation of the presence of an unclassified event in said acquired voltage and/or current trend, in case that said or each identified pattern does not comprise at least said predetermined number of characteristic parameters $c_{ik}$ of a classified event $E_i$.

12. The system for monitoring and analyzing electrical operating parameters of a load in an electric network, according to claim 2, wherein said microcontroller is arranged to carry out a computation of a plurality of physical quantities of interest starting from said acquired voltage and/or current trend.

13. The system for monitoring and analyzing electrical operating parameters of a load in an electric network, according to claim 2, wherein a graphic interface is also provided arranged to show to a user the possible presence of classified events $E_i$ and/or of unclassified events.

14. The system for monitoring and analyzing electrical operating parameters of a load in an electric network, according to claim 2, wherein said microcontroller is also arranged to carry out a filtering of said acquired voltage and/or current trend to remove signal noise.

15. The system for monitoring and analyzing electrical operating parameters of a load in an electric network, according to claim 2, wherein said periodic acquisitions of said values of voltage and of current are carried out with frequency f=10 KHz.

16. The system for monitoring and analyzing electrical operating parameters of a load in an electric network, according to claim 3, wherein said microcontroller is arranged to carry out a computation of a plurality of physical quantities of interest starting from said acquired voltage and/or current trend.

17. The system for monitoring and analyzing electrical operating parameters of a load in an electric network, according to claim 4, wherein said microcontroller is arranged to carry out a computation of a plurality of physical quantities of interest starting from said acquired voltage and/or current trend.

18. The system for monitoring and analyzing electrical operating parameters of a load in an electric network, according to claim 5, wherein said microcontroller is arranged to carry out a computation of a plurality of physical quantities of interest starting from said acquired voltage and/or current trend.

19. The system for monitoring and analyzing electrical operating parameters of a load in an electric network, according to claim 6, wherein said microcontroller is arranged to carry out a computation of a plurality of physical quantities of interest starting from said acquired voltage and/or current trend.

* * * * *